United States Patent [19]
Yamamura

[11] Patent Number: 5,272,677
[45] Date of Patent: Dec. 21, 1993

[54] SEMICONDUCTOR MEMORY DEVICE EQUIPPED WITH STEP-DOWN POWER VOLTAGE SUPPLY SYSTEM FOR SENSE AMPLIFIER CIRCUIT ARRAYS

[75] Inventor: Ryuji Yamamura, Tokyo, Japan
[73] Assignee: NEC Corporation, Tokyo, Japan
[21] Appl. No.: 958,795
[22] Filed: Oct. 9, 1992

[30] Foreign Application Priority Data
Oct. 9, 1991 [JP] Japan .................. 3-261558

[51] Int. Cl.$^5$ .................................. G11C 7/00
[52] U.S. Cl. ........................ 365/227; 365/230.03; 365/230.06
[58] Field of Search ........... 365/227, 230.03, 230.06, 365/189.07, 189.09, 202

[56] References Cited
U.S. PATENT DOCUMENTS

| | | | |
|---|---|---|---|
| 4,701,885 | 10/1987 | McElroy | 365/230.03 X |
| 4,908,798 | 3/1990 | Urai | 365/230.03 |
| 5,157,631 | 10/1992 | Shinogawa | 365/202 X |
| 5,208,774 | 5/1993 | Shibue | 365/227 X |

Primary Examiner—Eugene R. LaRoche
Assistant Examiner—Do Hyun Yoo
Attorney, Agent, or Firm—Sughrue, Mion, Zinn, Macpeak & Seas

[57] ABSTRACT

A dynamic random access memory device includes a plurality of memory cell plates each having memory cells and a sense amplifier circuit array selectively coupled with the memory cells, and the sense amplifier circuit array selectively enters a standby mode and amplifying mode depending upon first and second driving signals supplied thereto, wherein the first and second driving signals are regulated to an intermediate voltage level between a step-down power voltage level and a ground voltage level in the standby mode with a main step-down power voltage signal supplied from a main step-down circuit; however, the first and second driving signals are changed to the step-down voltage level and the ground voltage level with an auxiliary step-down power voltage signal produced from an external power voltage signal at an auxiliary step-down circuit exclusively associated therewith so that undesirable voltage fluctuation hardly takes place on a main step-down power voltage line.

5 Claims, 5 Drawing Sheets

SEMICONDUCTOR MEMORY DEVICE EQUIPPED WITH STEP-DOWN POWER VOLTAGE SUPPLY SYSTEM FOR SENSE AMPLIFIER CIRCUIT ARRAYS

FIELD OF THE INVENTION

This invention relates to a semiconductor memory device and, more particularly, to an internal step-down power voltage supply system incorporated in, for example, a dynamic random access memory device.

DESCRIPTION OF THE RELATED ART

Figure 1:
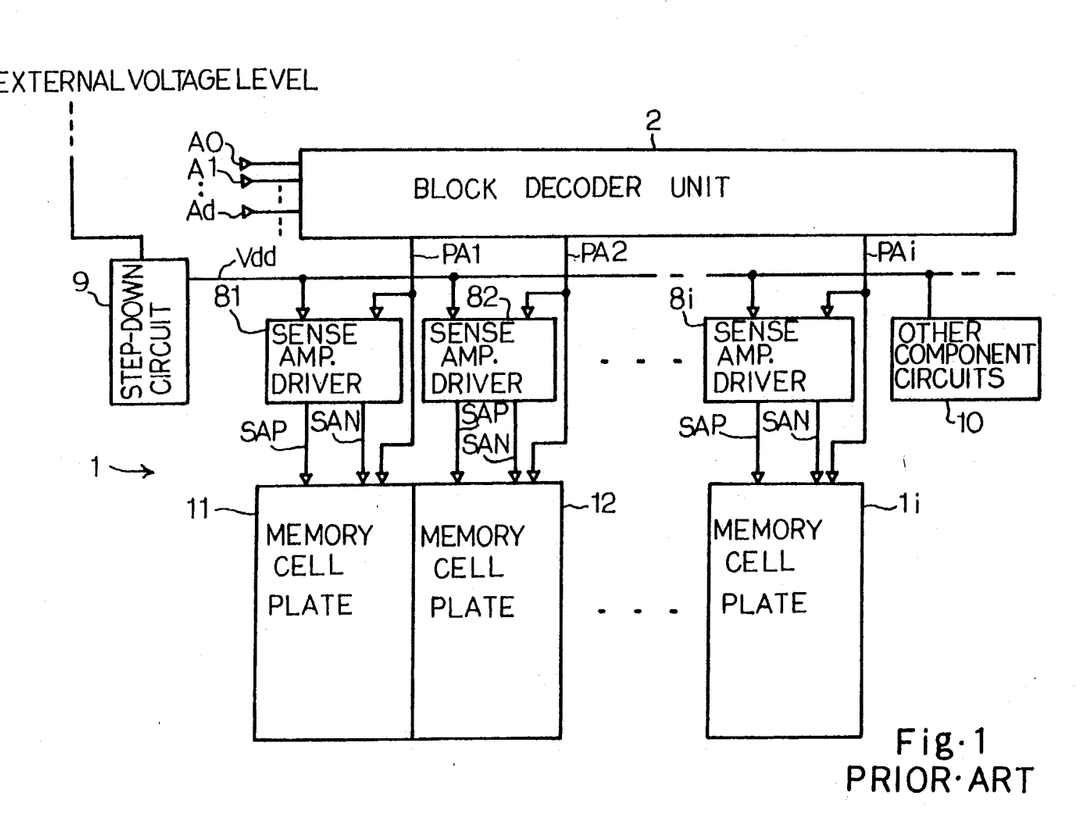
FIG. 1 is a block diagram showing the power voltage supply system incorporated in the prior art random access memory device.

A typical example of a 16 mega-bit dynamic random access memory device is illustrated in FIG. 1, and the data storage unit 1 incorporated therein is broken down into a plurality of memory cell plates 11, 12, ... and 1i. A 64 mega-bit dynamic random access memory device is also equipped with a memory cell array broken down in to a plurality of memory cell plates. The data storage unit 1 broken down into the memory cell plates 11 to 1i is selectively activated for data read-out and data write-in, and is desirable for an ultra large scale integration, because the current consumption is smaller than a memory cell array simultaneously activated for data read-out and data write-in.

For the memory cell plates 11 to 1i, address predecoded signals A0 to Ad are supplied to a block decoder unit 2, and the block decoder unit 2 selectively shifts selecting signals PA1, PA2 and PAi to active low voltage level. The selecting signals PA1 to PAi are respectively supplied to the memory cell plates 11 to 1i, and one of the memory cell plates 11 to 1i with the selecting signal of the active low voltage level starts precharge/equalization of bit line pairs as described hereinbelow. However, the other selecting signals cause the associated memory cell plates to remain inactive.

Figure 2:
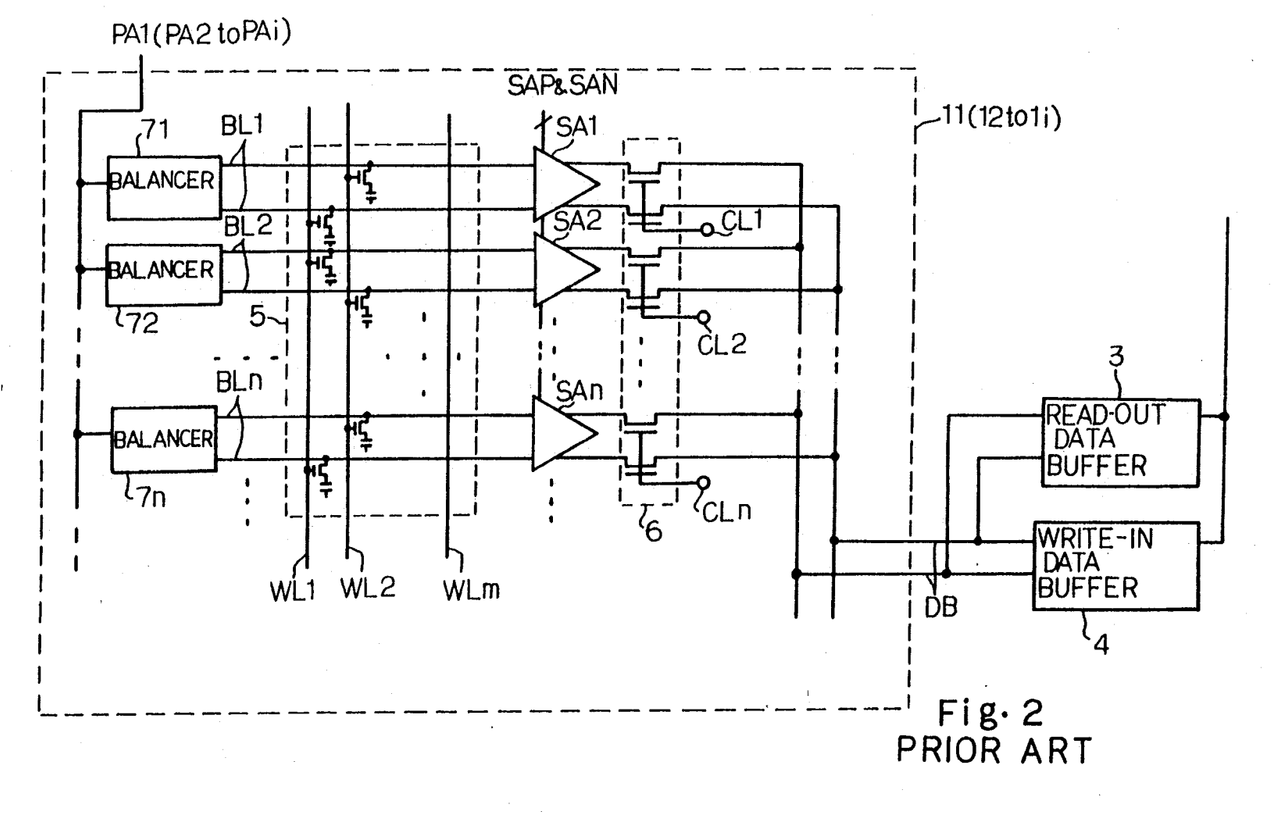
FIG. 2 is a circuit diagram showing the arrangement of the memory cell plate incorporated in the prior art random access memory device.

FIG. 2 shows the circuit arrangement of each memory cell plate 11, 12 or 1i, and the memory cell plate 11, 12 or 1i is coupled through a data bus system DB with a read-out data buffer circuit 3 and a write-in data buffer circuit 4. The memory cell plate 11, 12 or 1i comprises a memory cell sub-array 5 associated with word lines WL1, WL2 and WLm and with bit line pairs BL1, BL2 and BLn, sense amplifier circuits SA1, SA2 and SAn respectively coupled with the bit line pairs BL1 to BLn, a transfer gate array 6 coupled between the sense amplifier circuits SA1 to SAn and the data bus system DB, and balancers 71, 72 and 7n. The memory cells are of the one-transistor one-capacitor type, and data bits are respectively stored in the storage capacitors in the form of electric charges. The word lines WL1 to WLm are selectively coupled with the gate electrodes of the switching transistors of the memory cells, and the drain nodes of the switching transistors are selectively coupled with the bit lines of the associated bit line pairs BL1 to BLn. The balancers 71 to 7n are responsive to the selecting signal PA1, PA2 or PAi, and carries out precharge/equalization on the bit line pairs BL1 to BLn for a predetermined time period.

Figure 3:
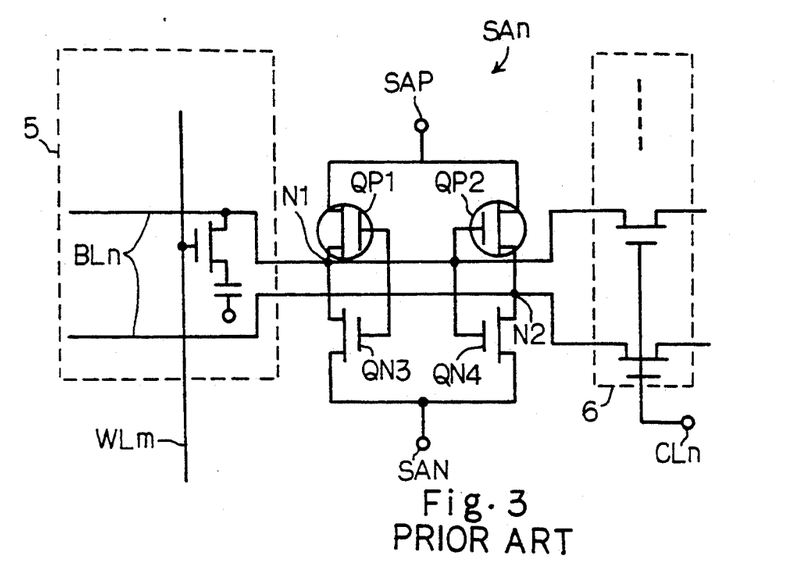
FIG. 3 is a circuit diagram showing the circuit arrangement of the sense amplifier circuit incorporated in the memory cell plate.

FIG. 3 shows the circuit arrangement of the sense amplifier circuit SAn, and the other sense amplifier circuits are similar in circuit arrangement to the sense amplifier circuit SAn. The sense amplifier circuit SAn comprises two series combinations of p-channel enhancement type amplifier transistors QP1 and QP2 and n-channel enhancement type amplifier transistors QN3 and QN4 coupled between driving signal lines SAP and SAN, and the bit lines BLn are coupled with the common drain nodes N1 and N2 of the two series combinations. The common drain nodes N1 is respectively coupled with the gate electrode of the p-channel enhancement type amplifier transistor QP2 and the gate electrode of the n-channel enhancement type amplifier transistor QN4, and the other common drain node N2 is coupled with the gate electrode of the p-channel enhancement type amplifier transistor QP1 and the gate electrode of the n-channel enhancement type amplifier transistor QN3. When small differential voltage level is applied between the common drain nodes N1 and N2, difference in channel conductivity takes place between the two series combinations, and the small differential voltage level is developed toward the voltage levels at the driving signal lines SAP and SAN.

Figure 4:
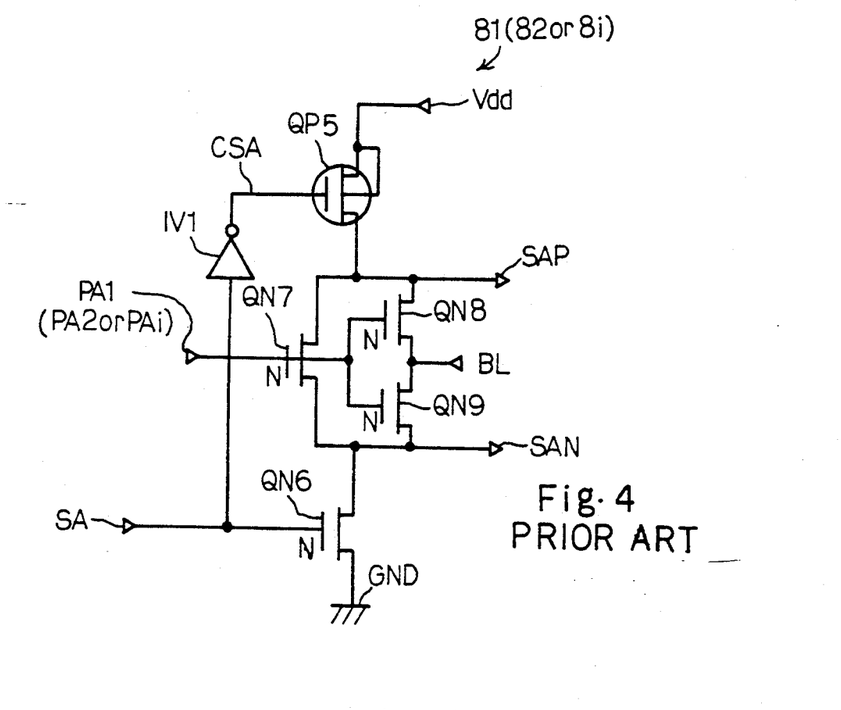
FIG. 4 is a circuit diagram showing the circuit arrangement of the sense amplifier driver incorporates in the power voltage supply system.

The sense amplifier circuits SA1 to SAn thus arranged are coupled through the driving signal lines SAP and SAN with one of sense amplifier drivers 81. 82 and 8i as shown in FIG. 1. The amplifier drivers 81 to 8i are respectively associated with the memory cell plates 11 to 1i, and FIG. 4 illustrates the circuit arrangement of each of the sense amplifier drivers 81 to 8i. Each sense amplifier driver comprises a p-channel enhancement type switching transistor QP5 coupled at the source node thereof with the power voltage line Vdd, an n-channel enhancement type switching transistor QN6 coupled at the source node thereof with a ground voltage line GND, an n-channel enhancement type switching transistor QN7 coupled between the drain node of the p-channel enhancement type switching transistor QP5 and the drain node of the n-channel enhancement type switching transistor QN6, a series combination of n-channel enhancement type switching transistors QN8 and QN9 coupled in parallel to the n-channel enhancement type switching transistor QN7, and an inverter coupled between the gate electrode of the n-channel enhancement type switching transistor QN6 and the gate electrode of the p-channel enhancement type switching transistor QP5. An activation signal SA is directly supplied to the gate electrode of the n-channel enhancement type switching transistor QN6, and the complementary signal CSA of the activation signal SA is supplied from the inverter IV1 to the gate electrode of the p-channel enhancement type switching transistor QP5. The selecting signal PA1, PA2 or PAi is supplied to the gate electrodes of the n-channel enhancement type switching transistors QN7 to QN9, and a balance voltage level BL is applied to the source nodes of the n-channel enhancement type switching transistors QN8 and QN9.

The sense amplifier driver thus arranged behaves as follows. While the associated memory cell plate is not selected, the selecting signal PA1, PA2, ... or PAi remains in the high voltage level, and the n-channel enhancement type switching transistors QN7 to QN9 turn on, and the driving signal lines SAP and SAN are equalized at the balancing voltage level BL. However, if the associated memory cell plate is selected, the balancers 71 to 7n charges and balances the bit line pairs BL1 to BLn in response to the selecting signal PA1, PA2 or PAi of the active low voltage level, and the selecting signal PA1, PA2, ... or PAi causes the n-channel enhancement type switching transistors QN7 to QN9 to turn off. However, the activation signal SA remains in the low voltage level during the precharge/equalization, and the driving signal lines SAP and SAN are kept in the balancing voltage level BL. Upon completion of the precharge/equalization, differential voltage levels indicative of data bits are produced on the bit line pairs BL1 to BLn, and the activation signal SA is lifted to the high voltage level. Then, the p-channel enhancement type switching transistor QP5 and the n-channel enhancement type switching transistor QN6 turn on so as to supply the power voltage level Vdd and the ground voltage level to the driving signal lines SAP and SAN, respectively. With the power voltage level Vdd and the ground voltage level, the sense amplifier circuits SA1 to SAn develop the differential voltage levels to the power voltage level Vdd and the ground voltage level.

As will be seen from FIG. 1, the power voltage level Vdd is supplied from a step-down circuit 9 to the sense amplifier drivers 81 to 8i, and the power voltage level Vdd of 3.0 volts is produced from external voltage level of 5.0 volts. The step-down circuit 9 distributes the power voltage level Vdd through a power voltage line Vdd to not only the sense amplifier drivers 81 to 8i but also other component circuits 10. The step-down power voltage level Vdd is desirable for the miniaturized component field effect transistors, because the extremely thin gate oxide films are prevented from hot carriers, and enhances the reliability.

Tuning back to FIG. 2 of the drawings, description is made on a read-out cycle and a write-in cycle of the prior art dynamic random access memory device. When starting a read-out cycle, the balancers 71 to 7n are responsive to one of the selecting signals PA1, PA2 and PAi, and balances the bit lines of the associated pair with each other at the intermediate voltage level between power voltage level Vdd and the ground voltage level. The word lines WL1 to WLm are selectively boosted over the power voltage level Vdd by a row address decoder (not shown), and the storage capacitors of the selected memory cells are coupled through the switching transistors with the associated bits lines. The bit line pairs BL1 to BLn propagate differential voltage levels indicative of data bits from the selected memory cells to the sense amplifier circuits SA1 to SAn, and the sense amplifier circuits SA1 to SAn develop the differential voltage levels, respectively. Namely, the amplifier drivers 81 to 8i selectively drive the driving signal lines SAP and SAN to the power voltage level Vdd and the ground voltage level. Then, the differential voltage levels on the bit line pairs BL1 to BLn are developed to the power voltage level Vdd and the ground voltage level. The transfer gate array 6 is responsive to column selecting signals CL1, CL2 and CLn from a column selector circuit (not shown), and one of the bit line pairs BL1 to BLn is coupled through the transfer gate array 6 with the read-out data buffer circuit 3. As a result, one of the differential voltage levels is transferred from the selected bit line pair to the data bus DB, and the read-out data buffer circuit 3 produces an output data signal from the developed differential voltage level.

In a write-in cycle, the control circuit 2 causes one of the balancers 71 to 7n to balance the bit lines at the intermediate voltage level again. One of the word lines WL1 to WLm is boosted over the power voltage level Vdd, and data bits are read out on the bit line pairs BL1 to BLn again. A write-in data bit is supplied from an external device to the write-in data buffer circuit 4, and differential voltage level indicative of the write-in data bit is applied to the data bus DB. The differential voltage level indicative of the write-in data bit is transferred through the transfer gate array 6 to one of the bit line pairs BL1 to BLn, and one of the sense amplifier drivers 81 to 8i drives the sense amplifier circuits SA1 to SAn through the driving signal lines SAP and SAN. The differential voltage level on the selected bit line pair is either inverted or maintained depending of the logic level of the write-in data bit, and the differential voltage levels on the other bit line pairs are developed for refresh. The write-in data bit is stored in one of the selected memory cells, and the refreshed data bits are restored in the other selected memory cells. Since the selected word line is boosted over the power voltage level Vdd, the power voltage level Vdd is applied to the storage capacitors without voltage drop.

A problem is encountered in that prior art dynamic random access memory device in that voltage fluctuation takes place on the power voltage line Vdd due to simultaneous amplification of the differential voltage levels on the bit line pairs BL1 to BLn. In detail, even though the memory cell array 1 is broken down into the memory cell plates 11 to 1i, the sense amplifier circuits SA1 to SAn are concurrently driven for developing the differential voltage levels on the bit line pairs BL1 to BLn, and a large amount of current is supplied from one of the sense amplifier drivers 81 to 8i to the sense amplifier circuits SA1 to SAn. Such a large amount of current is causative of voltage fluctuation on the power voltage line Vdd, and affects the other component circuits 10. This results in noises on, for example, the ground voltage line, and the noises reduces the operating margin of the sense amplifier circuits SA1 to SAn. Thus, the fluctuation on the power voltage line Vdd has serious influence on the function of the random access memory device.

Moreover, the step-down power voltage level Vdd is distributed through the power voltage line Vdd, and the time constant is varied with the length from the step-down circuit 9 to the sense amplifier drivers 81 to 8i. As a result, the sense amplifier drivers 81 to 8i are not uniform in current driving capability in initial stage of the activation of the sense amplifier circuits SA1 to SAn, and the differential voltage levels are developed to different levels depending upon the selected memory cell plate.

SUMMARY OF THE INVENTION

It is therefore an important object of the present invention to provide a semiconductor memory device a step-down power supply system of which keeps power voltage level constant.

To accomplish the object, the present invention proposes to supply a step-down power voltage level from one of auxiliary step-down circuits to an associated sense amplifier driving circuit while sense amplifier circuits develop data bits.

In accordance with the present invention, there is provided a semiconductor memory device fabricated on a single semiconductor chip, comprising: a) a plurality of memory cell plates each having a-1) a plurality of addressable memory cells respectively storing data bits, and a-2) a plurality of sense amplifier circuits selectively entering a standby mode and an amplifying mode of operation depending upon first and second driving signals, and selectively coupled with the plurality of addressable memory cells in the amplifying mode for quickly discriminating logic levels of data bits supplied from addressable memory cells of the plurality of addressable memory cells; b) an addressing means operative to select one of the plurality of memory cell plates, and selectively coupling the plurality of addressable memory cells of the aforesaid one of the plurality of memory cell plates with the plurality of sense amplifier circuits associated therewith, the addressing means further operative to couple the plurality of sense amplifier circuits with a data buffer unit; c) a plurality of sense amplifier driving circuits respectively associated with the plurality of memory cell plates, and each regulating the first and second driving signals to an intermediate voltage level between a step down power voltage level and a low voltage level in the standby mode, each of the plurality of sense amplifier driving circuits being further operative to change the first and second driving signals to the step-down power voltage level and the low voltage level, respectively, in the amplifying mode; d) a main step-down circuit operative to produce a main step-down power voltage signal of the step-down power voltage level from an external power voltage signal, and selectively distributing the main step-down power voltage signal to component circuits; and e) a plurality of auxiliary step-down circuits respectively associated with the plurality of memory cell plates, and each serving as one of the component circuits, each of the plurality of auxiliary step-down circuits being operative to transfer the main step-down power voltage signal to the associated sense amplifier driving circuit in the standby mode and to produce an auxiliary step-down power voltage signal of the step-down power voltage level from the external power voltage signal in the amplifying mode for supplying to the associated sense amplifier driving circuit.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 5:
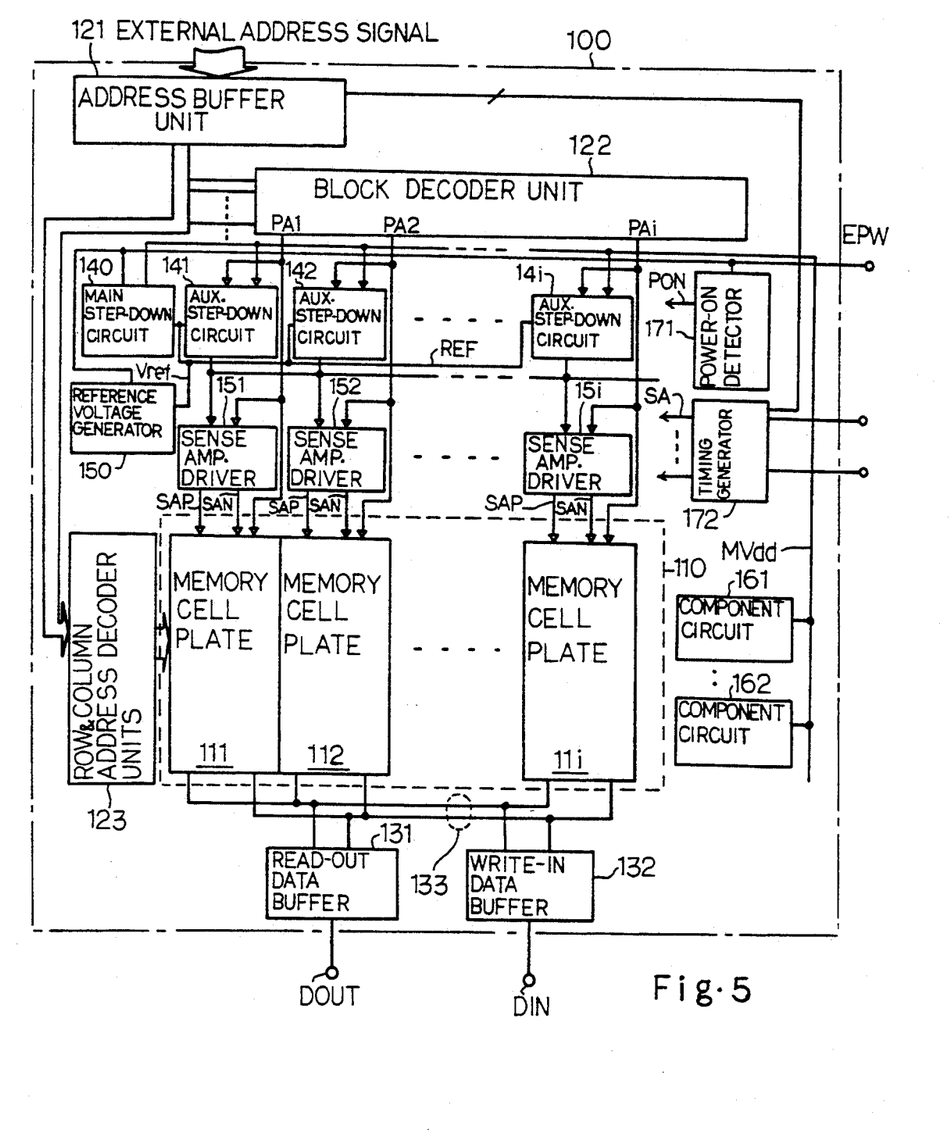
FIG. 5 is a block diagram showing the arrangement of a dynamic random access memory device according to the present invention.

Referring to FIG. 5 of the drawings, a random access memory device embodying the present invention is fabricated on a single semiconductor chip 100, and largely comprises a data storage facility 110, an addressing system, a step-down power voltage supply system, a data transferring system and a timing control system. The data storage facility is implemented by a plurality of memory cell plates 111, 112, ... and 11i, and the memory cell plates 111 to 11i are similar in arrangement to the memory cell plate shown in FIG. 2. For this reason, no further description is incorporated hereinbelow. The sense amplifier circuits incorporated in each memory cell plate 111 to 11i are further similar to the sense amplifier circuit shown in FIG. 3, and description on the circuit arrangement thereof is omitted for the sake of simplicity.

The addressing system comprises an address buffer unit 121, a block decoder unit 122 and row and column address decoder units 123. An external address signal is supplied to the address buffer unit 121, and the address buffer unit 121 produces address predecoded signals from the external address signal. The address predecoded signals are selectively supplied to the block decoder unit 122 and to the row and column address decoder units 123, and selects a memory cell from the data storage facility 110. Namely, the block decoder unit 122 selectively shifts selecting signals PA1, PA2, ... and PAi to active low voltage level, and one of the memory cell plate 111 to 11i starts on precharge/equalization with the selecting signal of the active low voltage level. However, no precharge/equalization is carried out in the other memory cell plates. The selecting signal of the active low voltage level allows the memory cell plate to enter active state, and the other memory cell plates remain in inactive state. The row and column address decoder units 123 selectively drive the word lines WL1 to WLm and the column selecting signals CL1 to CLn, and one of the memory cells is selected from the memory cell plate in the active state. The selected memory cell is communicable with a read-out data buffer unit 131 and a write-in data buffer unit 132 through a data bus 133. The read-out data buffer unit 131 and the write-in data buffer unit 132 are respectively coupled with an output data pin DOUT and an input data pin DIN, and form the data transferring system together with the data bus.

The step-down power supply system comprises a main step-down circuit 140, a plurality of auxiliary step-down circuits 141, 142, ... and 14i, a reference voltage generator 150 and a plurality of sense amplifier driving circuits 151, 152, ... and 15i. The main step-down circuit 140 produces a main step-down power voltage signal MVdd from an external power voltage signal EPW, and distributes the main step-down power voltage signal MVdd through a main step-down power voltage line MVdd to component circuits. The auxiliary step-down circuits 141 to 14i and component circuits 161 to 162 form pairs of the component circuits coupled with the main step-down power voltage line MVdd. As described hereinlater, the selecting signals PA1 to PAi are respectively supplied to the auxiliary step-down circuits 141 to 14i, and the reference voltage generator 150 produces a reference voltage signal Vref indicative of the step-down power voltage level for distributing to the auxiliary step-down circuits 141 to 14i. The sense amplifier driving circuits 151 to 15i are similar in circuit arrangement to the sense amplifier driving circuit shown in FIG. 4, and no further description is incorporated for avoiding repetition.

Finally, the timing controlling system comprises a power-on detector 171 and a timing generator 172. When the external power voltage signal EPW starts rising, the power-on detector 171 keeps a detecting signal PON in the low voltage level. However, if the external power voltage signal EPW exceeds a certain level, the power-on detector 171 shifts the detecting signal PON to the high voltage level, and the detecting signal PON is supplied to the auxiliary step-down circuit 141 to 14i as will be described hereinlater. Various external control signals and the address signal is supplied to the timing generator 172, and the timing generator 172 sequentially produces internal timing control signals so as to control the sequence of a write-in cycle and the sequence of a read-out cycle. One of the internal timing control signals is an activation signal SA indicative of the starting point of sense amplification, and the activation signal SA is also supplied to the auxiliary step-down circuits 141 to 14i. While the activation signal SA remains in inactive low voltage level, the sense amplifier circuits of the selected memory cell plate are in the standby mode, and the precharge/equalization is carried out. However, upon completion of the precharge/equalization, the activation signal SA goes up to the active high voltage level, and the sense amplifier circuits of the selected memory cell plate start on developing differential voltage levels on the bit line pairs. The other internal timing control signals are less important in view of the gist of the present invention, and no further description is incorporated hereinbelow.

Figure 6:
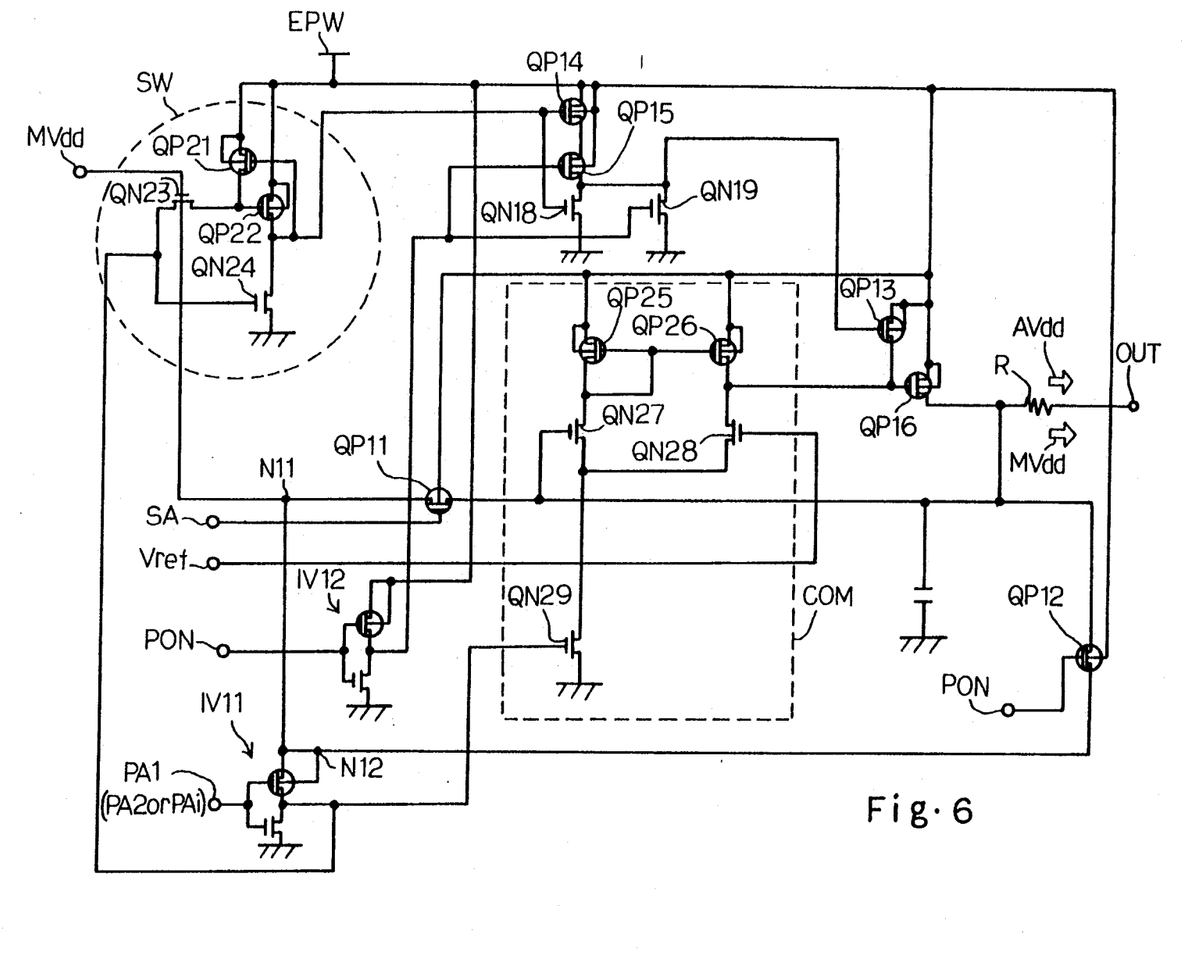
FIG. 6 is a circuit diagram showing the circuit arrangement of a step-down circuit incorporated in the dynamic random access memory device.

Turning to FIG. 6 of the drawings, the circuit arrangement of each auxiliary step-down circuit 141, 142, ... or 14i is illustrated, and comprises a switching circuit SW, a voltage comparator COM, two inverters IV11 and IV12, p-channel enhancement type field effect transistors QP11, QP12, QP13, QP14, QP15 and QP16, n-channel enhancement type field effect transistors QN18 and QN19, and a resistor R. An output node OUT is coupled with the associated sense amplifier driving circuit, and the auxiliary step-down circuit either transfers the main step-down power voltage signal MVdd to or produces an auxiliary step-down power voltage signal AVdd at the output node OUT. The switching circuit SW comprises two p-channel enhancement type field effect transistors QP21 and QP22 and two n-channel enhancement type field effect transistors QN23 and QN24, and the voltage comparator COM comprises two p-channel enhancement type field effect transistors QP25 and QP26 and three n-channel enhancement type field effect transistors QN27, QN28 and QN29. In this instance, the p-channel enhancement type field effect transistors QP11 and QP16 serve as a transfer gate and a variable load transistor, respectively, and the switching circuit SW, the two inverters IV11 and IV12, the p-channel enhancement type field effect transistors QP12, QP13, QP14 and QP15 and the n-channel enhancement type field effect transistors QN18 and QN19 as a whole constitute a controlling circuit.

Each of the auxiliary step-down circuits 141 to 14i thus arranged behaves as follows. When the external power voltage signal EPW starts on rising, the detecting signal PON keeps the detecting signal PON in the low voltage level, and the p-channel enhancement type field effect transistor QP12 is turned on. However, the p-channel enhancement type field effect transistor QP16 is turned off. As a result, the main step down power voltage line MVdd is coupled through the nodes N11 and N12, the p-channel enhancement type field effect transistor QP12 and the resistor R with the output node OUT, and the voltage level at the output node OUT is increased together with the main step-down power voltage signal MVdd. Upon reaching the certain voltage level, the detecting signal PON goes up to the high voltage level, and the p-channel enhancement type field effect transistor QP12 turns off. With the detecting signal PON of the high voltage level, the inverter IV12 supplies the low voltage level to the gate electrode of the p-channel enhancement type field effect transistor QP15 and to the gate electrode of the n-channel enhancement type field effect transistor QN19. Then, the p-channel enhancement type field effect transistor QP15 turns on, and the n-channel enhancement type field effect transistor QN19 turns off.

While the auxiliary step-down circuit shown in FIG. 6 remains in the inactive state, the selecting signal PA1, PA2, ... or PAi is kept in the high voltage level, and the activation signal SA remains in the low voltage level. As a result, the inverter IV11 supplies the low voltage level to the gate electrodes of the n-channel enhancement type field effect transistors QN29 and QN24, and causes those field effect transistors QN29 and QN24 to turn off. The voltage comparator COM remains in the inactive state, and the p-channel enhancement type field effect transistor QP11 turns on. For this reason, the main step-down power voltage signal MVdd is supplied through the p-channel enhancement type field effect transistor QP11 to the output node OUT.

If the block decoder unit 122 selects the memory cell plate associated with the auxiliary step-down circuit shown in FIG. 6, the selecting signal PA1, PA2, ... or PAi goes down to the low voltage level, and the balancers of the selected memory cell plate charge the associated bit lines, and the sense amplifier circuits enter the standby mode. In this situation, the inverter IV11 supplies the main step-down power voltage signal MVdd to the gate electrodes of the n-channel enhancement type field effect transistors QN29 and QN24 so that the n-channel enhancement type field effect transistors QN29 an QN24 turn on. The n-channel enhancement type field effect transistor QN24 causes the external power voltage signal EPW to reach the gate electrode of the p-channel enhancement type field effect transistor QP13 through the p-channel enhancement type field effect transistors QP14 and QP15. This results in that the p-channel enhancement type field effect transistor QP13 turns off, and the voltage comparator COM becomes operable. However, the activation signal SA remains in the low voltage level in the standby mode, and the main step-down power voltage signal MVdd is still supplied to the output node OUT and, accordingly, to the associated sense amplifier driving circuit. With the main step-down power voltage signal, the associated sense amplifier driving circuit balances the driving signal lines SAP and SAN at the balancing voltage level so that the sense amplifier circuits of the selected memory cell plate do not develop any differential voltage on the associated bit line pairs.

Upon completion of the precharge/equalization, the activation signal SA goes up to the high voltage level, and the p-channel enhancement type field effect transistor QP11 turns off. Since the voltage comparator COM has been already activated, the voltage comparator COM controls the channel resistance of the p-channel enhancement type field effect transistor QP16, and regulates the auxiliary step-down power voltage signal AVdd to the step-down power voltage level indicated by the reference voltage signal Vref. Current is supplied through the p-channel enhancement type field effect transistor QP16 to the output node OUT, and, accordingly, the auxiliary step-down power voltage signal AVdd is produced from the external power voltage signal EPW. Therefore, the auxiliary step-down power voltage signal AVdd is supplied to the associated sense amplifier driving circuit in the amplification mode, and the sense amplifier driving circuit lifts the driving signal line SAP to the step-down voltage level. Even if the sense amplifier circuits of the selected memory cell plate are concurrently activated for developing the differential voltage levels on the bit line pairs, the concurrent activation does not affect the main step-down power voltage signal, and any malfunction does not take place.

As will be appreciated from the foregoing description, the auxiliary step-down circuits 141 to 14i eliminate voltage fluctuation from the main step-down power voltage line MVdd, and the dynamic random access memory device is free from malfunction due to the concurrent activation of the sense amplifier circuits.

Although a particular embodiment of the present invention has been shown and described, it will be obvious to those skilled in the art that various changes and modifications may be made without departing from the spirit and scope of the present invention. For example, the combination of the sense amplifier driving circuits and the auxiliary step-down circuits may be incorporated in a semiconductor memory device of another type such as, for example, a static random access memory device.

What is claimed is:

1. A semiconductor memory device fabricated on a single semiconductor chip, comprising:
   a) a plurality of memory cell plates each having
      a-1) a plurality of addressable memory cells respectively storing data bits, and
      a-2) a plurality of sense amplifier circuits selectively entering a standby mode and an amplifying mode of operation depending upon first and second driving signals, and selectively coupled with said plurality of addressable memory cells in said amplifying mode for quickly discriminating logic levels of the data bits supplied from said plurality of addressable memory cells;
   b) an addressing means operative to select one of said plurality of memory cell plates, and selectively coupling said plurality of addressable memory cells of said each of said plurality of memory cell plates with said plurality of sense amplifier circuits associated therewith, said addressing means further operative to couple said plurality of sense amplifier circuits of said each memory cell plate with a data buffer unit;
   c) a plurality of sense amplifier driving circuits respectively associated with said plurality of memory cell plates, and each regulating said first and second driving signals to an intermediate voltage level between a step-down power voltage level and a low voltage level in said standby mode, each of said plurality of sense amplifier driving circuits being further operative to change said first and second driving signals to said step-down power voltage level and said low voltage level, respectively, in said amplifying mode;
   d) a main step-down circuit operative to produce a main step-down power voltage signal of said step-down power voltage level from an external power voltage signal, and selectively distributing said main step-down power voltage signal to component circuits; and
   e) a plurality of auxiliary step-down circuits respectively associated with said plurality of memory cell plates, and each serving as one of said component circuits, each of said plurality of auxiliary step-down circuits being operative to transfer said main step-down power voltage signal to the associated sense amplifier driving circuit in said standby mode and to produce an auxiliary step-down power voltage signal of said step-down power voltage level from said external power voltage signal in said amplifying mode for supplying to the associated sense amplifier driving circuit.

2. A semiconductor memory device as set forth in claim 1, in which each of said plurality of addressable memory cells is implemented by a series combination of a switching transistor and a storage capacitor, each of said data bits being stored in the form of electric charges and supplied to one of said plurality of sense amplifier circuits in the form of a differential voltage level.

3. A semiconductor memory device as set forth in claim 2, in which each of said plurality of sense amplifier circuits comprises a-2-1) a series combination of a first enhancement type field effect transistor of a first channel conductivity type and a second enhancement type field effect transistor of a second channel conductivity type opposite to said first channel conductivity type coupled between a first signal line for said first driving signal and a second signal line for said second driving signal, and a-2-2) a series combination of a third enhancement type field effect transistor of said first channel conductivity type and a fourth enhancement type field effect transistor of said second channel conductivity type coupled between said first and second signal lines, said differential voltage level being applied between a first common drain node of said first and second enhancement type field effect transistors and a second common drain node of said third and fourth enhancement type field effect transistors, said first common drain node being coupled with the gate electrodes of said third and fourth enhancement type field effect transistors, said second common drain node being coupled with the gate electrodes of said first and second enhancement type field effect transistors.

4. A semiconductor memory device as set forth in claim 3, in which each of said plurality of sense amplifier driving circuits comprises c-1) a fifth enhancement type field effect transistor coupled between the associated auxiliary step-down circuit and said first signal line, c-2) a sixth enhancement type field effect transistor coupled between a source of said low voltage level and said second signal line, c-3) a seventh enhancement type field effect transistor coupled between said fifth and sixth enhancement type field effect transistors, c-4) a series combination of eighth and ninth enhancement type field effect transistors coupled between said fifth and sixth enhancement type field effect transistors in parallel to said seventh enhancement type field effect transistor, c-5) a source of said intermediate voltage level coupled with a common source node of said eighth and ninth enhancement type field effect transistors, and c-6) an inverter having an output node coupled with the gate electrode of said fifth enhancement type field effect transistor, an activation signal indicative of the starting point of said amplifying mode being supplied to an input node of said inverter and the gate electrode of said sixth enhancement type field effect transistor so that said fifth and sixth enhancement type field effect transistors concurrently turning on in said amplifying mode, a selecting signal indicative of said each of said plurality of memory cell plates being supplied to the gate electrodes of said seventh to ninth enhancement type field effect transistors so that said seventh to ninth enhancement type field effect transistors are shifted from on-state to off-state when the associated memory cell plate is selected.

5. A semiconductor memory device as set forth in claim 4, in which each of said plurality of auxiliary step-down circuits comprises e-1) a transfer gate coupled between said main step-down circuit and an output node coupled with the associated sense amplifier driving circuit, and responsive to said activation signal for blocking said output node from said main step-down circuit, e-2) a variable load transistor coupled between a third signal line for said external power voltage signal and said output node, e-3) a voltage comparator coupled between said third signal line and said source of said low voltage level, and comparing the voltage level at said output node with a reference voltage signal indicative of said step-down power voltage level for causing said variable load transistor to regulate the voltage level at said output node to said step-down power voltage level, and e-4) a controlling circuit responsive to said selecting signal for activating said voltage comparator and said variable load transistor.

* * * * *